(12) United States Patent
Dannoux et al.

(10) Patent No.: US 9,527,724 B2
(45) Date of Patent: Dec. 27, 2016

(54) DIRECT SEALING OF GLASS MICROSTRUCTURES

(75) Inventors: Thierry Luc Alain Dannoux, Avon (FR); Paulo Gaspar Jorge Marques, Le Chatelet en Brie (FR); Ronan Tanguy, Grez sur Loing (FR)

(73) Assignee: Corning Incorporated, Corning, NY (US)

( * ) Notice: Subject to any disclaimer, the term of this patent is extended or adjusted under 35 U.S.C. 154(b) by 279 days.

(21) Appl. No.: 13/989,897

(22) PCT Filed: Nov. 28, 2011

(86) PCT No.: PCT/US2011/062180
§ 371 (c)(1),
(2), (4) Date: May 28, 2013

(87) PCT Pub. No.: WO2012/074894
PCT Pub. Date: Jun. 7, 2012

(65) Prior Publication Data
US 2013/0243663 A1    Sep. 19, 2013

(30) Foreign Application Priority Data
Nov. 30, 2010 (EP) .................... 10306318

(51) Int. Cl.
B81C 1/00 (2006.01)
B01L 3/00 (2006.01)
C03B 23/24 (2006.01)

(52) U.S. Cl.
CPC ...... B81C 1/00119 (2013.01); B01L 3/502707 (2013.01); B81C 1/00357 (2013.01);
(Continued)

(58) Field of Classification Search
CPC ............. B81C 1/00119; B81C 1/00357; B81C 2203/036; C03B 23/245; B01L 3/502707; B01L 2200/12; B01L 2300/0887; B81B 2201/051
See application file for complete search history.

(56) References Cited

U.S. PATENT DOCUMENTS

| 2003/0106799 A1 | 6/2003 | Covington et al. ........... 204/600 |
| 2003/0192587 A1 | 10/2003 | Guzman et al. ........... 137/15.01 |
| 2010/0178214 A1* | 7/2010 | Marques .............. B01J 19/0093 422/139 |

FOREIGN PATENT DOCUMENTS

| EP | 1964816 | 9/2008 |
| WO | 00/21659 | 4/2000 |

OTHER PUBLICATIONS

International Searching Authority; International Search Report; Mailing Date: Feb. 16, 2012; pp. 1-3.

* cited by examiner

Primary Examiner — Lore Jarrett (57) ABSTRACT

Embodiments of methods for sealing a glass microstructure assembly comprise providing one or more side retainer members on a base plate adjacent the glass microstructure assembly, the side retainer members having a height less than an uncompressed height defined by the glass microstructure assembly. The methods also comprise compressing the glass microstructure assembly via a load bearing top plate in intimate contact with the top glass layer while heating the glass microstructure assembly and the top plate to a glass sealing temperature, the glass sealing temperature being a temperature sufficient to make glass viscous, wherein the glass microstructure assembly is compressed until the load bearing top plate contacts the side retainer members, and wherein the lower surface of the top plate maintains adhesion to the upper surface of the top glass layer (Continued)

at the glass sealing temperature while the load bearing plate is supported by the side retainer members.

18 Claims, 6 Drawing Sheets

(52) U.S. Cl.
CPC ......... *C03B 23/245* (2013.01); *B01L 2200/12* (2013.01); *B01L 2300/0887* (2013.01); *B81B 2201/051* (2013.01); *B81C 2203/036* (2013.01)

DIRECT SEALING OF GLASS MICROSTRUCTURES

This application claims the benefit of priority under 35 USC §119 to European Patent Application Serial No. 10306318.6 filed on Nov. 30, 2010 the content of which is relied upon and incorporated herein by reference in its entirety.

BACKGROUND

The present disclosure is generally directed to methods of making glass microstructures, and, more specifically, to methods of making glass microstructures via sealing of a plurality of glass layers.

SUMMARY

Microfluidic assemblies are devices comprising microreactors, which may also be referred to as microchannel reactors. A microreactor is a device in which a moving or static target sample is confined and subject to processing. In some cases, the processing involves the analysis of chemical reactions. In others, the processing is executed as part of a manufacturing process utilizing two distinct reactants. In still others, a moving or static target sample is confined in a microreactor as heat is exchanged between the sample and an associated heat exchange fluid. In any case, the microreactors are defined according to the dimensions of their channels, which are generally on the order of from 0.1 to 5 mm, desirably from 0.5 to 2 mm. Microchannels are the most typical form of such confinement and the microreactor is usually a continuous flow reactor, as opposed to a batch reactor. The reduced internal dimensions of the microchannels provide considerable improvement in mass and heat transfer rates. In addition, microreactors offer many advantages over conventional scale reactors, including vast improvements in energy efficiency, reaction speed, reaction yield, safety, reliability, scalability, etc.

There are various different technologies for microreactor manufacturing, such as the hot pressing technology. Hot pressing technology replicates the features of patterned graphite molds onto softened glass sheets through a hot pressing operation. This forming step is followed by either glass to glass sealing or frit-assisted sealing to form complete micro-channel devices.

The main advantage of the frit-based approach is that robust sealing can be achieved at higher viscosity ($10^{10}$ to $10^{12}$ poises) compared with usual glass/glass sealing ($10^8$ to $10^6$ poises). For the frit-based approach, a lower softening point temperature than the glass may be utilized. In this approach, it is possible to seal 3D glass microstructures while maintaining initial geometry and dimensions of micro features, thereby allow repeatable fluidic properties such as internal volume and pressure drop of the different reactant and cooling channels. Frit sealing nevertheless requires significant additional steps such as frit preparation, frit uniform deposition and finally frit sintering. Each of these steps complicate the formulating of the frit material composition because of the considerations of expansion mismatch, chemical compatibility, mechanical resistance, particle size distribution, and frit solution sedimentation.

As a result, glass-to-glass direct sealing is desirable, because it eliminates these process steps and avoids many complex problems associated with powder processing. Glass-to-glass sealing is operated at such temperature that glass viscosity permit the surfaces to be sealed in intimate contact in order to achieve a chemical bonding. In addition, the temperature and the sealing time have to be chosen carefully in order to permit the surface tension of glass to fuse the parts together and eliminate sharp angles that are detrimental to the mechanical strength. This robust bonding is generally achieved at a temperature near the softening point of the glass; however, at this viscosity, the glass fluidic modules may undesirably slump under gravity action. In additional, the use of an external load (typically 1-2 g/cm$^2$) is often applied on top of the assembly to force the contact between pressed glass sheets; however, the addition of extra load accelerates viscous flow and deformation of the glass structures.

Embodiments of the present invention are directed to eliminating slumping and deformation in the glass microstructure by including side retainer members that share or absorb the weight of an external load plate to allow the accomplishment of robust sealing of glass layers while preventing any uncontrolled prohibitive microchannel deformation due to viscous flow, and non-stick load bearing plates that adhere to glass at high temperatures, thereby eliminating slumping of the glass microstructure and facilitating surface tension sealed channel joint rounding in more optimal thermal conditions. Without being bound by theory, embodiments of the present invention are directed to improved methods of glass sealing which achieve this side retainer assisted adhesion phenomenon between the glass and the non-stick plate (e.g., graphite) to assist in the direct sealing of glass microstructures.

According to one embodiment, a method of sealing a glass microstructure assembly is provided. The method comprises providing a base plate as a support for the glass microstructure assembly, providing the glass microstructure assembly comprising one or more patterned glass layers disposed over the base plate, and a top glass layer stacked on the one or more patterned glass layers, wherein at least one channel is formed between the top glass layer and the one or more patterned glass layers. The method further comprises providing a load bearing top plate on an upper surface of the top glass layer such that a lower surface of the top plate intimately contacts the upper surface of the top glass layer, wherein the top plate is comprised of a non-glass composition, and providing one or more side retainer members on the base plate adjacent the glass microstructure assembly, the side retainer members having a height less than an uncompressed height defined by the glass microstructure assembly. Moreover, the method comprises compressing the glass microstructure assembly via the load bearing top plate in intimate contact with the top glass layer while heating the glass microstructure and the top plate to a glass sealing temperature, the glass sealing temperature being a temperature sufficient to make the glass viscous, wherein the load bearing top plate vertically compresses the viscous glass in the glass microstructure assembly until the load bearing top plate contacts and is supported by the side retainer members, and wherein the lower surface of the top plate maintains adhesion to the upper surface of the top glass layer at the glass sealing temperature while the load bearing plate is supported by the side retainer members.

According to a further embodiment, the method of sealing may further comprise removing the sharp angles of the at least one channel by maintaining the glass microstructure assembly at the glass sealing temperature for about 2 to about 4 hours, wherein the heating of the glass microstructure assembly increases surface tension in the glass microstructure assembly, and thereby smoothes the sharp angles of the at least one channel.

These and other features, aspects, and advantages of the present invention will become better understood with reference to the following description, appended claims, and accompanying drawings.

BRIEF DESCRIPTION OF THE DRAWINGS

Though the specification concludes with claims particularly pointing out and distinctly claiming the invention, it is believed that the present invention will be better understood from the following description taken in conjunction with the accompanying drawings, in which:

DETAILED DESCRIPTION

Features and advantages of the invention will now be described with occasional reference to specific embodiments. However, the invention may be embodied in different forms and should not be construed as limited to the embodiments set forth herein. Rather, these embodiments are provided so that this disclosure will be thorough and complete and will fully convey the scope of the invention to those skilled in the art.

Referring to a method embodiment of sealing a glass microstructure assembly 100 as illustrated in FIGS. 1-4, the method comprises providing a base plate 200 as a support for the glass microstructure assembly 100. The base plate 200, which is optional since any bottom surface or substrate is suitable, may comprise a non-glass composition, which does not adhere to any layers of the glass microstructure assembly 100. The base plate 200 composition must also be durable at temperature above 1000° C. In one embodiment, the base plate 200 may comprise graphite, for example, the commercial graphite material utilized in the top glass layer 110 of the glass microstructure assembly 100 as described below.

Figure 1:
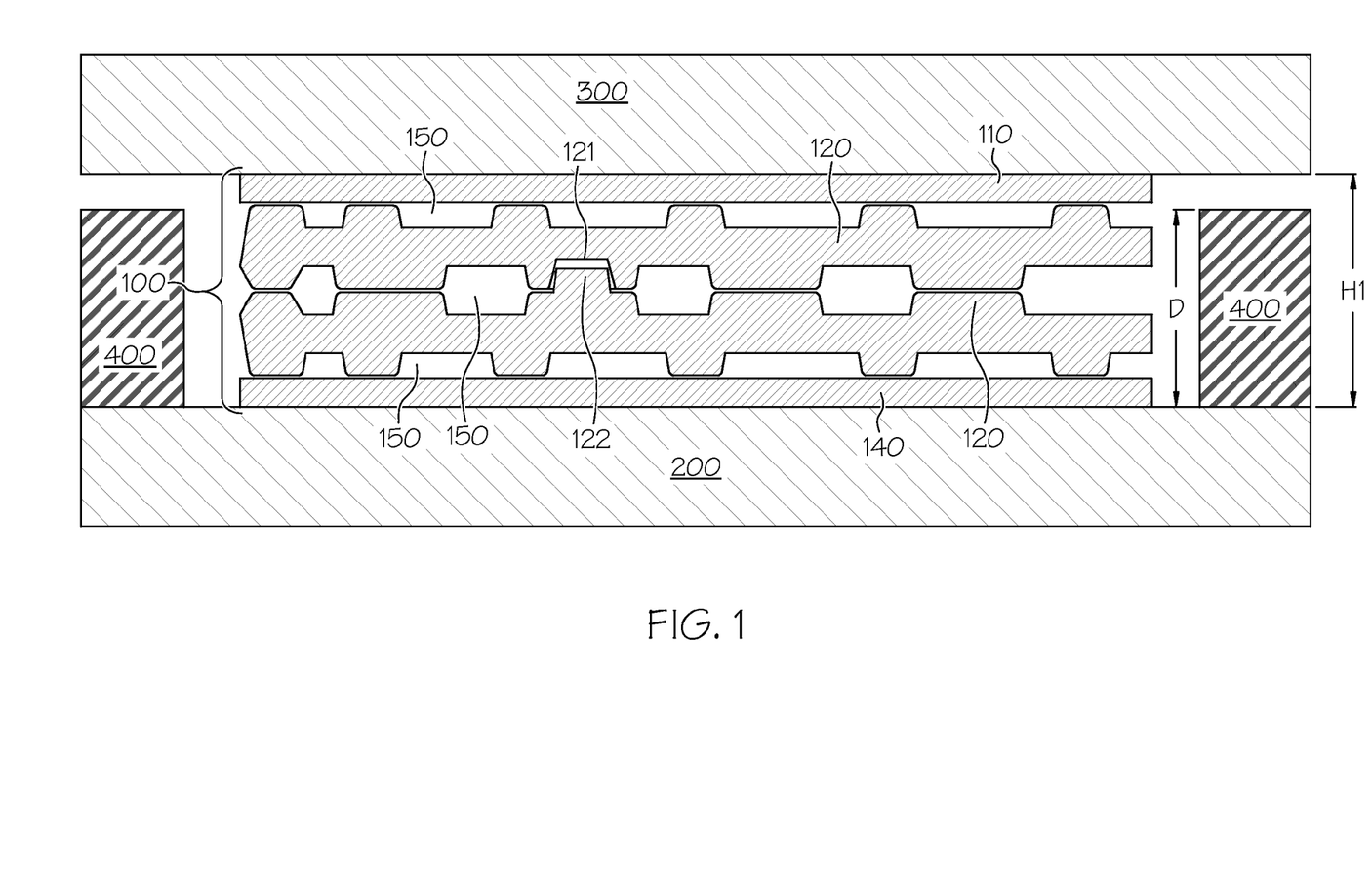
FIG. 1 is a schematic view of a glass microstructure assembly prior to sealing according to one or more embodiments of the present invention.

In the embodiment of FIG. 1, the layers of the glass microstructure assembly 100 are stacked to facilitate the necessary intimate contact required for glass surfaces of the glass microstructure assembly 100 to be sealed. The glass microstructure assembly 100 may comprise one or more patterned glass layers 120 disposed over the base plate 200. Referring to FIG. 1, the patterned glass layers 120 have a plurality of projections disposed on the upper and lower surfaces of the patterned glass layers 120. Moreover, the glass microstructure assembly 100 may also comprise a top glass layer 110 stacked on the one or more patterned glass layers 120. While the top glass layer 110 is depicted in FIG. 1 as having flat upper and lower surfaces, it is contemplated that the upper and lower surfaces may be patterned similarly to the patterned glass layers 120. However, if the upper surface of the top glass layer 110 is patterned, it must still maintain intimate contact with the lower surface of the load bearing top plate 300 across the entirety of the surface of the top glass layer 110. This intimate contact aspect is described in detail below.

Referring again to FIG. 1, the glass microstructure assembly 100 may also comprise a bottom glass layer 140 contacted and supported by the base plate 200. As shown, the one or more patterned glass layers 120 may be stacked on the bottom glass layer 140. In the embodiment of FIG. 1, the bottom glass layer 140 defines a substantially flat cross section on its upper and lower surfaces; however, like the top glass layer 110, it is contemplated that the bottom glass layer 140 is also patterned. That being said, the bottom glass layer 140 is optional, and it is thus contemplated to include the patterned glass layers 120 directly on the base plate 200, or another suitable substrate.

Referring again to FIG. 1, the stacking arrangement of the top glass layer 110 and the one or more patterned glass layers 120 forms at least one channel 150 between the top glass layer 110 and the one or more patterned glass layers 120. Moreover, stacking a plurality of patterned glass layers 120 may also form channels 150 between the patterned glass layers 120. Furthermore, at least one channel 150 may be formed between the bottom glass layer 140 and the one or more patterned glass layers 120. The forming and shaping of the channels 150 during the sealing process is described in greater detail below.

To yield the desired glass microstructure product, properly aligning the stacked layers of the glass microstructure assembly 100 may be beneficial. Referring to the embodiment of FIG. 1, the surfaces of the patterned glass layer 120 may be accurately aligned due to a tenon-mortise positioning system as would be familiar to one of ordinary skill in the art. As shown, a tenon 122 of one patterned glass layer 120 is inserted into a mortise 121 of another patterned layer 120 to insure proper alignment. Other engagement or couple mechanisms, for example, male-female coupling mechanisms, are contemplated as suitable for facilitating proper alignment of the layers in the glass microstructure assembly 100. While there are some contact points between layers prior to sealing as depicted in FIG. 1, there exist gaps of up to about 200 μm, or about 20-100 μm at 20° C. between layers in the glass microstructure assembly 100.

The glass of the glass microstructure assembly 100 may comprise various compositions, for example, glass, glass ceramic material, borosilicate glass, silica sheets or combinations thereof. Suitable commercial materials may include Vycor®, Jade®, Pyrex®, Eagle XG®, and Gorilla®, all of which are produced by Corning Incorporated. The combination of glass with other materials, such as ceramics (e.g., silicon carbide), metals and metal alloys (e.g., nickel, molybdenum, tungsten) are contemplated for the layers of the glass microstructure assembly 100. According to an alternative applicable to all embodiments described herein, filler materials, such as refractory powders of various kinds, may also be added into or included in the composition of the glass employed, such as to modify the mechanical or thermal characteristics of the resulting glass in any desirable way.

Further as shown in FIG. 1, a load bearing top plate 300 is provided on an upper surface of the top glass layer 110 such that a lower surface of the top plate 300 intimately contacts the upper surface of the top glass layer 110. As used herein, "intimately contacts" means that the entirety of the upper surface of the top glass layer 110 interfaces with the lower surface of the load bearing top plate 300, such that there are no spaces across the interface during the heat sealing process. The top plate 300 is comprised of a non-glass composition, which does not stick or adhere to glass at room temperature. As shown in the embodiment of FIG. 1, the load bearing top plate 300 has a substantially flat lower surface, and the top glass layer 110 has a substantially flat upper surface; however, it is contemplated that these surfaces could be patterned complementary surfaces that still maintain intimate contact.

In addition to being resistant to sticking to glass at room temperature, the composition of the top plate should be durable at temperatures above 1000° C. In one embodiment, the top plate 300 comprises graphite. Optionally, the graphite top plate 300 may be substantially free of carbon soot or dust on the lower surface of the graphite top plate 300. In a commercial embodiment, the top plate 300 may be produced from Mersen Ref 2020 graphite machined or grinded to a standard 50 μm flatness over 300 mm, wherein the lower surface of the graphite may typically define a roughness of 0.3 (grinded) to 3 μm (machined) RMS (root-mean-square). The top graphite plate may contain minor local surface degradation such as scratches or oxidation pitch; however, these minor imperfections do not affect the adhesion phenomenon as described below. These minor local effects are just replicated onto the viscous glass during the sealing cycle. It is contemplated that the top plate 300 may comprise various loads and surface areas. Specifically, it is desirable that the weight of the top plate 300 be significantly larger than the weight of the glass microstructure assembly. For example, the top plate 300 may comprise a weight of up to about 5000 g, or from about 500 to 3000 g, or from about 2500 to about 2700 g, or about 2600 g. Moreover, the surface areas of the top plate 300 may also vary as desired. In one embodiment, the top plate 300 may have dimension of about 250×300 mm.

Referring again to FIG. 1, one or more side retainer members 400 may be provided on the base plate 200 adjacent the glass microstructure assembly 100. In the pre-sealing arrangement of FIG. 1, the side retainer members 400 have a height D less than an uncompressed height H1 defined by the glass microstructure assembly 100. The height D of the side retainer members 400 is set to be the desired height of the glass microstructure product yielded from the sealing process. The difference between the height D of the side retainer members 400 and the uncompressed height H1 may vary. In one exemplary embodiment, the difference is about 300 μm. Various rigid thermally stable materials are contemplated as suitable for the side retainer members 400, for example, metals, ceramics, or alloys. In one embodiment, the side retainer members 400 comprise alumina. Optionally, the side retainer members 400 may be coated with a non-stick powder, for example, boron nitride, which prevents the side retainer member 400 from sticking to the glass of the glass microstructure assembly 100.

As described throughout this disclosure, the side retainer members 400 may deliver numerous benefits to the present glass sealing process. Without being bound by theory, the side retainer members 400 aid in preventing uncontrolled microstructure sagging over time during the sealing cycle. Side retainer members 400 allow the use of a relatively high sealing load used, while preventing negative effects of the sealing load on the second part of the thermal cycle. Such a heavy load would normally crush the glass fluidic module completely at such an elevated temperature. However, heavy loads are advantageous in the sealing operation in order to ensure intimate contact of the glass layers, and of the top glass layer 110 and the top plate 300, through flattening of distorted glass sheets and elimination of any difference in feature heights through deformation of, or penetration into other surfaces, of the tallest features in the softened glass. Once the side retainers are giving support to the load, the upper glass sheets become stuck to the top plate 300 as described in more detail below. Moreover, the side retainer members 400 in conjunction with the temporary adhesion described below simplify the glass-to-glass sealing process by eliminating additional complex steps such as frit preparation, frit uniform deposition, and frit sintering.

Figure 2:
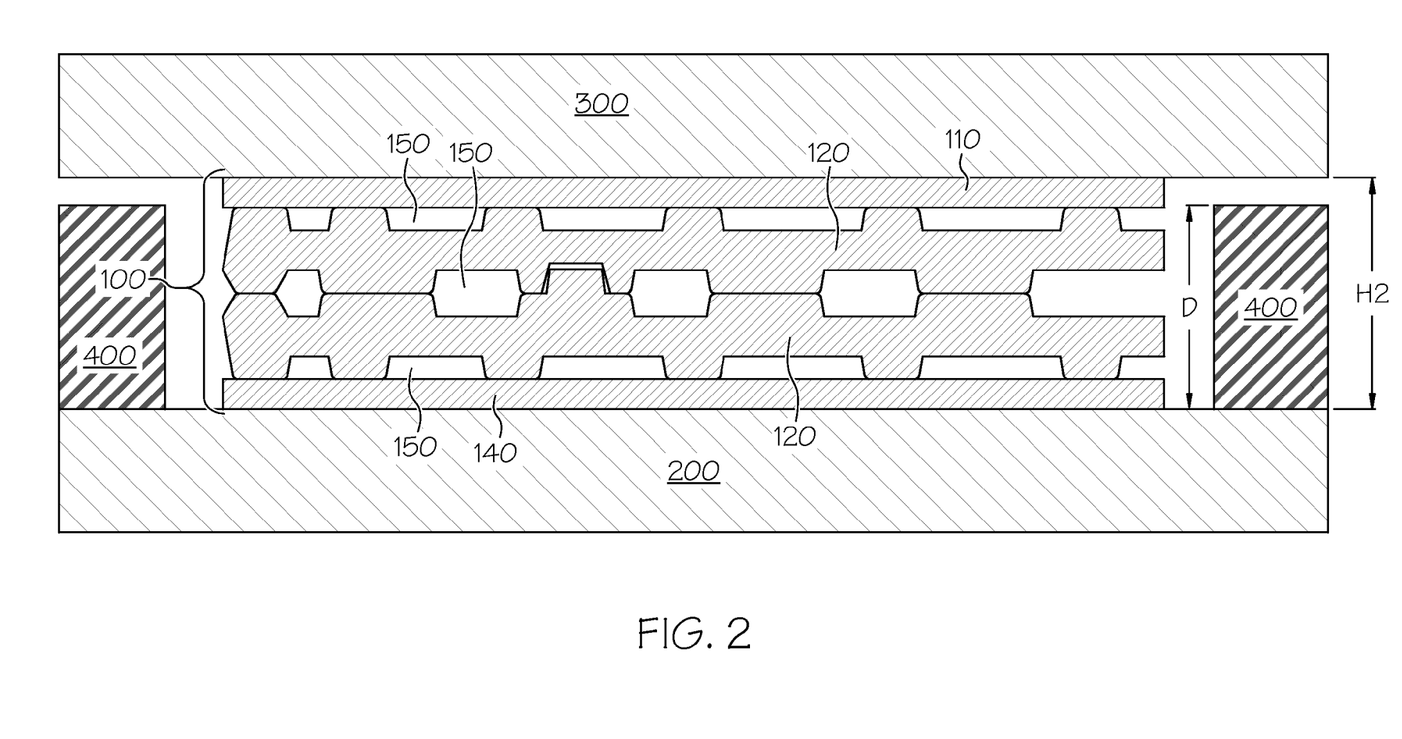
FIG. 2 is a schematic view of a glass microstructure assembly as it is heated to a glass sealing temperature according to one or more embodiments of the present invention.

FIG. 2 depicts the initial compression of the glass microstructure assembly 100. During this phase of compression shown in FIG. 2, the base plate 200, the top plate 300, the glass microstructure assembly 100, and the side retainer members 400 are heated to a glass sealing temperature. As used herein, the "glass sealing temperature" is defined as a temperature sufficient to make the glass viscous. As described above, the viscous flow of the glass materials is necessary for glass-to-glass sealing. In one embodiment, the glass sealing temperature is from about 5 to about 50° C. less than the glass softening temperature of the glass in the microstructure assembly. For example, the glass sealing temperature is from about 980 to about 1035° C., or from about 1000 to about 1020° C., or about 1010° C. At the glass sealing temperature, the glass viscosity may be at about $10^6$ to about $10^9$ poises, $10^7$ to about $10^8$ poises, or about $10^{7.5}$ poises.

Referring again to FIG. 2, as the glass microstructure assembly 100 is heated, the load bearing top plate 300 vertically compresses the viscous glass in the glass microstructure assembly 100. The compression decreases the height of the glass microstructure assembly 100 from the uncompressed height H1 of FIG. 1 to the slightly compressed height H2 of FIG. 2. In one exemplary embodiment, the difference between the height D of the side retainer members 400 and the slightly compressed height H2 is about 200 μm. Due to this slight compression, there are no longer any gaps between glass layers of the glass microstructure assembly 100 as the surfaces to be sealed are in contact.

Figure 3:
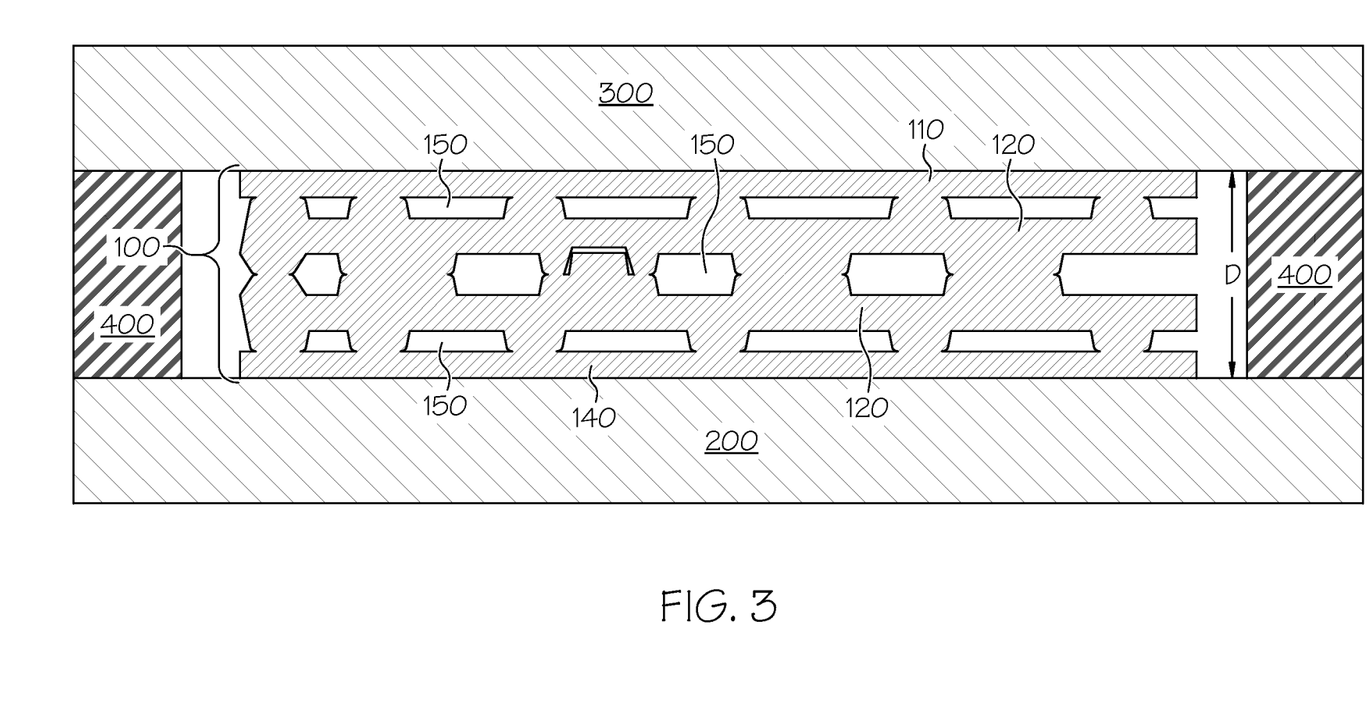
FIG. 3 is a schematic view of a glass microstructure assembly after it has been maintained at the glass sealing temperature for about 1 hour according to one or more embodiments of the present invention.

FIG. 3 depicts the phase of compression wherein the load bearing top plate 300 has compressed the glass microstructure assembly 100 such that the load bearing plate 300 contacts and is supported by the side retainer members 400. At this point, the height of the glass microstructure assembly 100 and the side retainer members 400 are identical. As the top plate 300 is in contact with the side retainer members 400, there is substantially no load applied on the glass microstructure assembly 100. Because the side retainer members 400 absorb the weight, the height of the glass microstructure assembly 100 does not further decrease as it is maintained at the glass sealing temperature. Without side retainer members 400, under the same load, the height of the glass microstructure assembly 100 would have decreased further the channels 150 therein would be flattened further. The phase of compression depicted in FIG. 3 occurs after the glass microstructure assembly 100 has been maintained at the glass sealing temperature for a period of from about 30 minutes to about 2 hours, or about 1 hour.

Figure 5A:
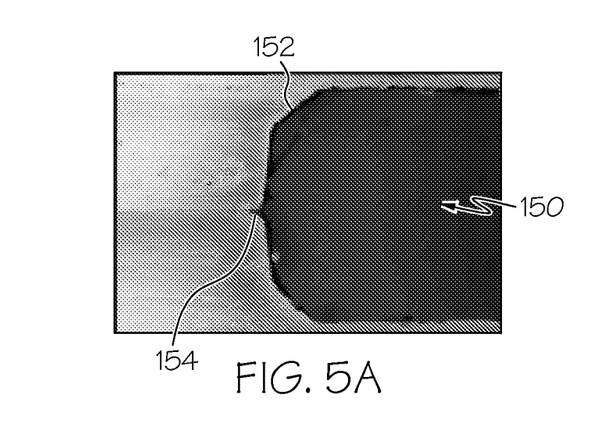
FIG. 5A is a micrograph of a channel in the glass microstructure assembly during heating up to the glass sealing temperature as depicted schematically in FIG. 1 according to one or more embodiments of the present invention.
Figure 5B:
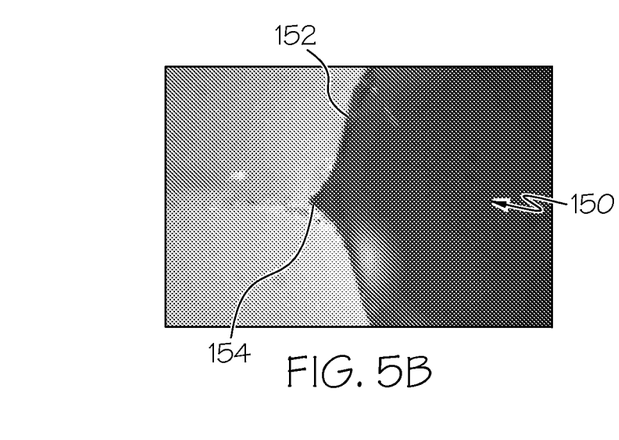
FIG. 5B is a micrograph of a channel after undergoing heat treatment at the glass sealing temperature for 2 hours according to one or more embodiments of the present invention.

Moreover, while the load of the top plate 300 is absorbed by the side retainer members 400 the viscosity of the glass becomes sufficiently low for the effects of the surface tension of the glass in the glass microstructure assembly 100 to round the channels 150 as shown in FIGS. 5A and 5B. FIG. 5A, which depicts a channel 150 during heating up to the glass sealing temperature as schematically shown in FIG. 2, has numerous sharp edges, for example, the 45° chamfer 152 and the sharp angled sealing joint 154 of the channel 150. The sealing joint 154 is formed from the junction of two stacked glass layers of the glass microstructure assembly 100.

Figure 4:
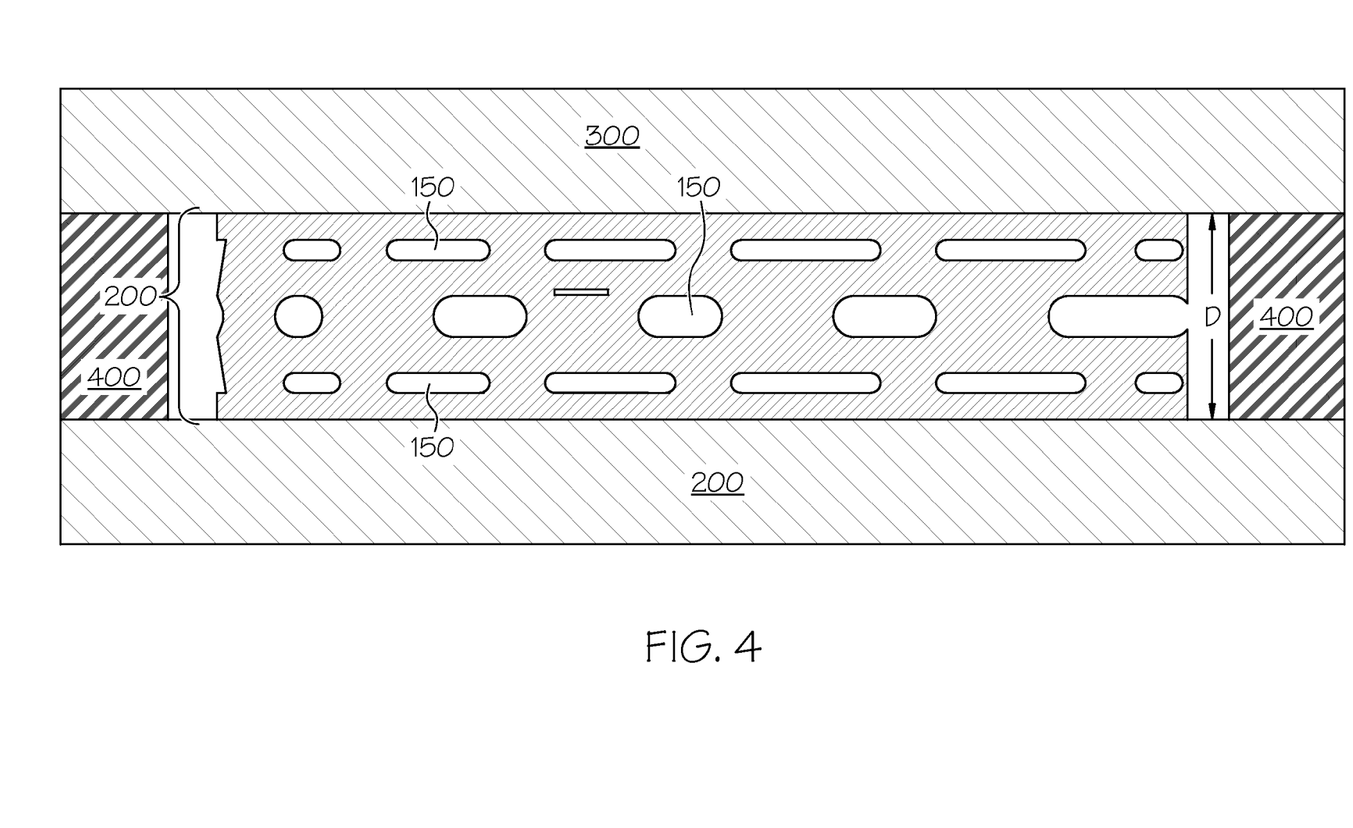
FIG. 4 is a schematic view of a glass microstructure assembly after it has been maintained at the glass sealing temperature for about 3 hours according to one or more embodiments of the present invention.

FIG. 4 depicts a glass microstructure assembly 100 after it has been maintained at the glass sealing temperature for a period sufficient for the sharp angles of the channels 150 to be rounded. For example, this may be achieved by maintaining the glass microstructure assembly 100 at the glass sealing temperature and the associated glass viscosity for about 2 to about 4 hours, or for about 3 hours. Sharp angles in the channel are undesirable for microreactors, because sharp angles can yield increased turbulence in the fluid flow in the microreactor, and also weakens the mechanical strength of the microreactors.

Referring to FIGS. 3 and 4, the load bearing top plate 300 remains in intimate contact with the top glass layer 110 even after the weight of the load bearing top plate 300 is shared or supported by the side retainer members 400. Specifically, the presently inventors surprisingly found that the lower surface of the load bearing top plate 300 adheres to the upper surface of the top glass layer 110 at the glass sealing temperature while the load bearing plate 300 is supported by the side retainer members 400.

Without being bound by theory, this temporary adhesion is achieved when the glass of the glass microstructure assembly is viscous and the upper surface of the top glass layer 110 is in intimate contact with the lower surface of the load bearing top plate 300. Maintaining close proximity between the top glass layer 110 and the load bearing top plate 300 at the glass sealing temperature facilitates adhesion via viscous sticking of glass penetrating surface micropores or any surface defects (e.g., scratches) being present on the load bearing top plate 300. If intimate contact is not achieved between the upper surface of the top glass layer 110 and the lower surface of the load bearing top plate 300 (for example, due to soot or carbon deposits on the lower surface of the top plate 300), the adhesion may be prevented. Moreover, this temporary adhesion effect is not observable at room temperature, thus it is necessary that the glass be viscous by being heated to the glass sealing temperature in order to achieve the adhesion effect.

This temporary adhesion provides numerous advantages to the glass sealing process. For example, the adhesion of the upper surface of the top glass layer 110 to the lower surface of the top plate 300 enables sealing at higher temperature and lower viscosity without losing the desired external (cosmetic) and internal (fluidic) properties geometry of the glass microstructure assembly 100. As described in more detail below, sealing at higher temperature and lower viscosity facilitates channel rounding and offers improved mechanical properties such as internal pressure resistance inside the glass microstructure assembly 100. Moreover, the temporary adhesion enlarges the operable glass sealing temperature and glass viscosity ranges used in the production of the glass microstructure product without losing geometrical control.

The adhesion forces between the top plate 300 and the top glass layer 110 may vary depending on the materials of the respective layers, and the processing conditions. For example, and not by way of limitation, adhesion forces of 10 N have been observed for contact surfaces of 160×260 nm or 180×200 mm. Adhesion forces greater than 10 N are contemplated herein.

Figure 5C:
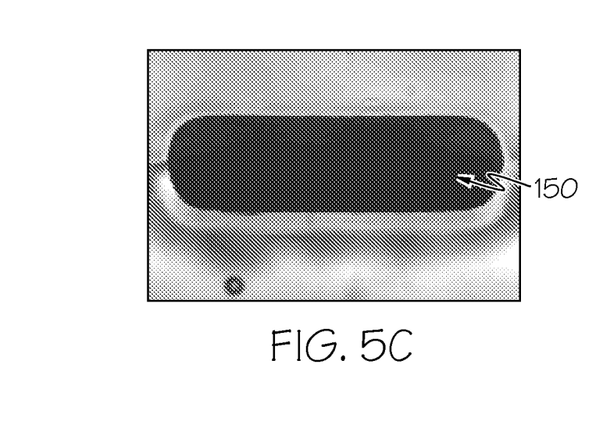
FIG. 5C is a micrograph of a channel after undergoing heat treatment at the glass sealing temperature for 3 hours according to one or more embodiments of the present invention.

After the channels 150 of the glass microstructure assembly 100 have been rounded to the optimal level as shown in FIGS. 4 and 5C, the glass microstructure assembly 100 is cooled to form a glass microreactor product. Various cooling rates and cooling times are contemplated herein. In one embodiment, the glass microstructure assembly is cooled to room temperature over a period of about 4 to about 6 hours. After cooling, there is no more visible interaction between the top plate 300 and the glass microstructure assembly 100, thus the top plate 300 may be used numerous times for the sealing of other glass microstructure assemblies 100.

EXAMPLE

The micrographs of FIGS. 5A-5C depict the progression of channel 150 rounding throughout the sealing process. The micrograph images were generated from an experiment wherein Corning Jade® 3D microstructures were sealed at a glass sealing temperature of about 1010° C. The glass microstructure was heated from room temperature up to 1010° C. in 3 hours. A 1700 g graphite top plate and alumina side retainer were used. After the heat sealing, the glass microstructure assembly was cooled down to room temperature in 6 hours. During the heating to the glass sealing temperature as depicted as shown in FIG. 5A, the applied load and the effect of the temperature initiate the sealing, but are insufficient to round the sealed joint 154 and the 45° chamfer 152. After 1 hour as depicted in FIG. 5B, the glass surface tension partially rounds the sharp angles of the channels 150. Specifically, the 45° chamfer is substantially removed; however, the sharp angle of the sealing joint 154 remains. At this point, the circuit internal pressure resistance is at or below 30 bars. After 3 hours as shown in FIG. 5C, the sharp angles of the sealing joint 154 are no longer visible, and the internal pressure resistance is raised to between 70 to 100 bars. If the sealing process is extended, for example, to 6 hours, no additional benefits are yielded. In fact, doubling the duration undesirably decreases the channel 150 height, and decreases the internal volume. Consequently, there is an optimum sealing duration, long enough for the surface tension for to rounding the channel contours but not so long as to increase slumping or sagging of the glass microstructure assembly 100, which results in an undesirable diminution of the circuit internal volume.

Figure 6:
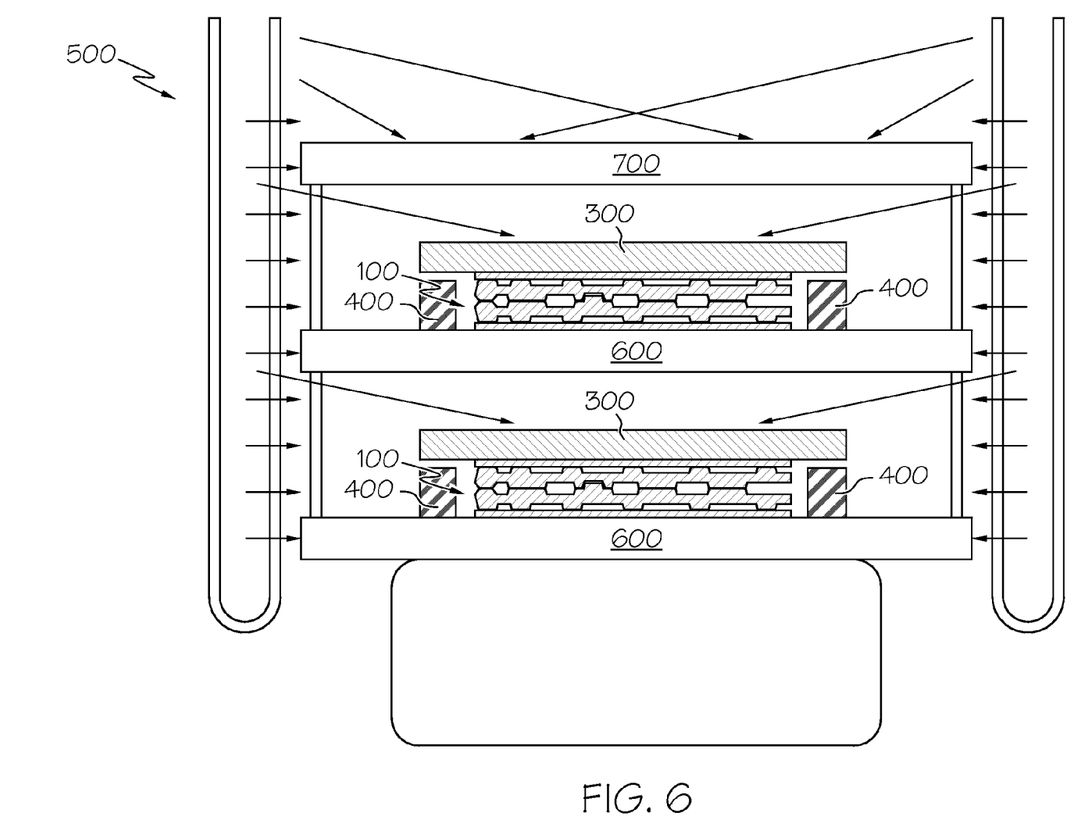
FIG. 6 is a schematic view of a heating device used to seal a plurality of glass microstructure assemblies simultaneously according to one or more embodiments of the present invention.

Various heating devices are contemplated for the present heating process. Referring to the embodiment of FIG. 6, multiple glass microstructure assemblies 100 may be sealed simultaneously. As shown, the heating device 500 may, in one of many contemplated embodiments, may comprise a multi-stair radiative heating assembly with two supporting lower plates 600 and a top plate 700. As show, the heating device 500 may comprise radiative elements on opposite sides of the glass microstructure assembly 100 to deliver uniform heating. The top plate 700 may prevent the upper glass microstructure assembly sample from experiencing a different top radiation heating profile than the lower glass microstructure assembly sample.

Unless otherwise defined, all technical and scientific terms used herein have the same meaning as commonly understood by one of ordinary skill in the art to which the invention belongs. The terminology used in the description herein is for describing particular embodiments only and is not intended to be limiting. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about." Accordingly, unless otherwise indicated, the numerical properties set forth in the specification and claims are approximations that may vary depending on the desired properties sought to be obtained in embodiments of the present invention. Notwithstanding that the numerical ranges and parameters setting forth the broad scope of the invention are approximations, the numerical values set forth in the specific examples are reported as precisely as possible. One of ordinary skill in the art will understand that any numerical values inherently contain certain errors attributable to the measurement techniques used to ascertain the values.

What is claimed is:

1. A method of sealing a glass microstructure assembly comprising:
   providing a base plate as a support for the glass microstructure assembly;
   providing the glass microstructure assembly comprising,
      one or more patterned glass layers disposed over the base plate, and
      a top glass layer stacked on the one or more patterned glass layers, the one or more patterned glass layers and the top glass layer comprising a glass;
      wherein at least a first channel is formed between the top glass layer and the one or more patterned glass layers,
   providing a load bearing top plate on an upper surface of the top glass layer such that a lower surface of the top plate intimately contacts the upper surface of the top glass layer, the top plate and the base plate being comprised of a non-glass composition;
   providing one or more side retainer members on the base plate adjacent the glass microstructure assembly, the one or more side retainer members extending upwardly a vertical distance less than an uncompressed height defined by the glass microstructure assembly;
   compressing the glass microstructure assembly via the load bearing top plate in intimate contact with the top glass layer while heating the glass microstructure and the top plate to a glass sealing temperature, the glass sealing temperature being a temperature sufficient to make the glass of the one or more patterned glass layers and the top glass layer viscoelastic with a viscosity of $10^6$ to $10^9$ poises, the load bearing top plate vertically compressing the glass until the load bearing top plate contacts and is supported by the one or more side retainer members, and the lower surface of the top plate adhering to the upper surface of the top glass layer at the glass sealing temperature while the load bearing plate is supported by the side retainer members.

2. The method of claim 1 wherein the load bearing top plate comprises a composition that does not adhere to the glass microstructure assembly at room temperature.

3. The method of claim 1 wherein the load bearing top plate has a flat lower surface, and the top glass layer has a substantially flat upper surface.

4. The method of claim 1 wherein the one or more side retainer members comprise alumina.

5. The method of claim 1 wherein the top plate comprises graphite.

6. The method of claim 5 wherein the graphite top plate is free of carbon soot or dust on the lower surface of the graphite top plate.

7. The method of claim 1 wherein the one or more patterned glass layers is stacked on a bottom glass layer comprising the glass, the bottom glass layer being contacted and supported by the base plate.

8. The method of claim 7 wherein the bottom glass layer defines a flat cross section on its upper and lower surfaces.

9. The method of claim 8 wherein the lower surface of the top glass layer is flat.

10. The method of claim 7 wherein at least a second channel is formed between the bottom glass layer and the one or more patterned glass layers.

11. The method of claim 1 wherein the heating of the glass microstructure assembly rounds one or more angles of the at least a first channel.

12. The method of claim 1 wherein the glass microstructure assembly is heated at the glass sealing temperature for from 2 to 4 hours.

13. The method of claim 12 wherein the glass microstructure assembly is heated at the glass sealing temperature for 3 hours.

14. The method of claim 1 further comprising cooling the glass microstructure assembly to form a glass microreactor.

15. A glass microreactor produced by the method of claim 14.

16. A method of sealing a glass microstructure assembly comprising:
   providing a glass microstructure assembly comprising,
      one or more patterned glass layers disposed over a base plate, and
      a top glass layer stacked on the one or more patterned glass layers
      wherein at least one channel is formed between the top glass layer and the one or more patterned glass layers;
   providing the base plate as a support for the glass microstructure assembly;
   providing a load bearing top plate on an upper surface of the top glass layer such that a lower surface of the top plate intimately contacts the upper surface of the top glass layer, the top plate and the base plate being comprised of a non-glass composition;
   providing one or more side retainer members on the base plate adjacent the glass microstructure assembly, the one or more side retainer members having a height less than an uncompressed height defined by the glass microstructure assembly;
   compressing the glass microstructure assembly via the load bearing top plate in intimate contact with the top glass layer while heating the glass microstructure assembly to a glass sealing temperature, the glass sealing temperature being a temperature sufficient to make the glass of the one or more patterned glass layers and the top glass layer viscous with a viscosity of $10^6$ to $10^9$ poises, wherein the load bearing top plate vertically compresses the glass until the load bearing top plate contacts and is supported by the one or more side retainer members, and wherein the lower surface of the top plate maintains adhesion to the upper surface of the top glass layer at the glass sealing temperature while the load bearing top plate is supported by the side retainer members, and removing sharp angles of the at least one channel by maintaining the glass microstructure assembly at the glass sealing temperature from 2 to 4 hours, wherein the heating of the glass microstructure assembly increases surface tension in the glass microstructure assembly, and thereby smoothes the sharp angles of the at least one channel.

17. The method of claim 16 further comprising cooling the glass microstructure assembly to form a glass microreactor.

18. A glass microreactor produced by the method of claim 17.

* * * * *